US006350685B1

United States Patent
Asahina et al.

(10) Patent No.: US 6,350,685 B1
(45) Date of Patent: Feb. 26, 2002

(54) METHOD FOR MANUFACTURING SEMICONDUCTOR DEVICES

(75) Inventors: Michio Asahina, Sakata; Eiji Suzuki, Fujimi-machi; Kazuki Matsumoto, Chino; Naohiro Moriya, Sakata, all of (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/412,200

(22) Filed: Oct. 5, 1999

(30) Foreign Application Priority Data

Oct. 6, 1998 (JP) ............................ 10-284606
Mar. 11, 1999 (JP) ............................ 11-064431

(51) Int. Cl.[7] .................................................... H01L 21/44
(52) U.S. Cl. .................. 438/660; 438/660; 438/653; 438/770; 438/775; 438/785; 257/758; 257/760; 257/763
(58) Field of Search ............................... 438/660, 770, 438/658, 775, 657, 785, 653, 763; 257/757–760, 763

(56) References Cited

U.S. PATENT DOCUMENTS

| 4,952,904 A | * | 8/1990 | Johnson et al. ............... 338/36 |
| 5,498,768 A | * | 3/1996 | Nishitani et al. ........... 437/192 |
| 5,523,626 A | * | 6/1996 | Hayashi et al. ............. 257/763 |
| 5,605,724 A | * | 2/1997 | Hong et al. .................. 427/535 |
| 5,739,046 A | * | 4/1998 | Lur et al. .................... 437/190 |
| 5,939,787 A | * | 8/1999 | Lee ............................. 257/740 |
| 5,972,178 A | * | 10/1999 | Narasimhan et al. .. 204/192.17 |
| 6,007,684 A | * | 12/1999 | Fu et al. ................. 204/192.17 |
| 6,042,929 A | * | 3/2000 | Burke et al. ................ 428/141 |
| 6,121,148 A | * | 9/2000 | Bashir et al. ............... 438/692 |
| 6,159,851 A | * | 12/2000 | Chen et al. ................. 438/669 |
| 6,274,487 B1 | * | 8/2001 | Suzuki ....................... 438/653 |

* cited by examiner

*Primary Examiner*—Matthew Smith
*Assistant Examiner*—Granvill D Lee, Jr.
(74) *Attorney, Agent, or Firm*—Hogan & Harston, L.L.P.

(57) ABSTRACT

A semiconductor device is manufactured by a method including the steps of forming a through hole in an interlayer dielectric layer (silicon oxide layer, BPSG layer, etc.) formed on a semiconductor substrate having a device element. A barrier layer is formed on surfaces of the interlayer dielectric layer and the through hole. A wiring layer is formed on the barrier layer. The barrier layer is formed by a method including the following steps. A titanium layer that forms at least a part of the barrier layer is formed. A heat treatment is conducted in a nitrogen atmosphere to form a titanium nitride layer at least on a surface of the titanium layer. The titanium nitride layer is contacted with oxygen in an atmosphere including oxygen. A heat treatment is conducted in a nitrogen atmosphere to form titanium oxide layers and to densify the titanium nitride layer.

14 Claims, 4 Drawing Sheets

Coolant | Coolant

Gas

METHOD FOR MANUFACTURING SEMICONDUCTOR DEVICES

BACKGROUND OF THE INVENTION

1. Field of the Invention

The present invention relates to a method for manufacturing semiconductor devices and, more particularly, to a method for manufacturing the semiconductor device that has an excellent barrier capability in a miniaturized contact section of the semiconductor device.

2. Description of Related Art

With higher device miniaturization, higher density integration and increased multiple layers of LSI devices, it has become an important subject to develop techniques for embedding wiring material in miniaturized through holes with greater aspect ratios. In the conventional technique, for example, a tungsten plug is embedded in a through hole in a contact section having an aperture diameter of 0.5 $\mu$m or smaller and an aspect ratio of 2 or greater. The tungsten plug is required in order to plug the through hole and to prevent reaction between aluminum of the wiring layer and silicon of the silicon substrate. However, such a contact structure tends to result in greater electrical resistance of the tungsten, deterioration of resistance to electromigration and lowered production yield due to its complicated forming process.

Many attempts are being made to develop techniques for embedding aluminum in through holes without requiring a complex embedding process that is currently required for embedding tungsten plugs. However, contact sections that use aluminum require complete countermeasures against junction leak that may be caused by reaction between the aluminum and silicon of the silicon substrate and also require a high barrier capability of a barrier layer.

For example, a barrier layer is formed from a nitride layer of a high melting point metal, such as a titanium nitride layer, that is directly formed by reaction sputtering in a nitrogen atmosphere. Such a barrier layer has the following problems.

① A titanium nitride layer, when formed by reactive sputtering in a nitrogen atmosphere, has an insufficient coverage. Therefore, the formed titanium nitride layer does not provide a sufficient coverage at a bottom portion of a miniaturized through hole that has a high aspect ratio.

② A titanium nitride layer, when formed by reactive sputtering in a nitrogen atmosphere, has large stresses and therefore tends to develop microscopic cracks. As a result, aluminum in the wiring material tends to diffuse and cause junction leaks.

③ A titanium nitride layer, when formed by reactive sputtering in a nitrogen atmosphere, has columnar structures. As a result, aluminum tends to diffuse through crystal grain boundaries and cause junction leaks.

④ The crystal orientation of a titanium nitride layer determines a <111> crystal orientation of an aluminum layer. Because the crystal orientation of a titanium nitride is not always uniform, the plane azimuth in the <111> crystal orientation of the aluminum layer differs. As a result, the surface of the aluminum layer roughens and mask alignment becomes difficult.

⑤ Further, a titanium nitride layer, when formed by reactive sputtering in a nitrogen atmosphere, occasionally peels off during film growth because of its own film stresses and therefore tends to generate particles. The particles pollute the surface of the wafer and cause short-circuits, which results in a lowered production yield.

SUMMARY OF THE INVENTION

It is an object of the present invention to provide a semiconductor device and a method for manufacturing thereof that enables optimum embedding of a conductive material in miniaturized contact sections having a size of a half-micron or less, and to achieve a high barrier capability without causing junction leaks.

In accordance with one embodiment of the present invention, a semiconductor device is manufactured by the process of forming a through hole in an interlayer dielectric layer that is formed on a semiconductor substrate having a device element. A barrier layer is formed on the interlayer dielectric layer and the through hole. A wiring layer is formed on the barrier layer. The wiring layer may preferably be formed from aluminum or an alloy including aluminum as a main component.

In one aspect of the embodiment of the present invention, the barrier layer is formed by a process including the following steps. (a) A metal layer that forms the barrier layer is deposited on surfaces of the interlayer dielectric layer and the through hole; preferably, the metal layer is formed by a sputtering method or a chemical vapor deposition (CVD) method. (b) Heat treatment is conducted in a nitrogen atmosphere to form a metal nitride layer at least on a surface of the metal layer. (c) The metal nitride layer is brought in contact with oxygen in an atmosphere including oxygen. (d) Heat treatment is conducted in a nitrogen atmosphere to form a metal oxide layer and densify the metal nitride layer.

The step of forming a barrier layer in accordance with an embodiment of the present invention may preferably include step (e) of conducting an oxygen plasma treatment after step (d).

In accordance with a preferred embodiment, a metal layer for a barrier layer is formed first by a sputtering method or a CVD method, and then, the metal layer is subjected to a heat treatment in a nitrogen atmosphere to form a metal nitride layer. As a result, the metal nitride film is formed with a higher cohesiveness with a better coverage at the bottom area of the through hole compared to a metal nitride film that is directly grown by sputtering a metal nitride. Moreover, a barrier layer formed by the process described above has a greatly improved barrier capability, mainly because the metal nitride layer in the barrier layer is densified and the metal oxide layer is formed in the barrier layer.

In accordance with one embodiment, the barrier layer may be formed from a metal oxide layer and a metal nitride layer. In accordance with another embodiment, the barrier layer may be formed from a first metal oxide layer composed of an oxide of a metal that forms the barrier layer, a metal nitride layer composed of a nitride of the metal that forms the barrier layer, and a second metal oxide layer composed of an oxide of the metal that forms the barrier layer.

The metal that forms the barrier layer may preferably include at least one selected from a group consisting of titanium, cobalt, ruthenium, molybdenum, hafnium, niobium, vanadium, tantalum, and tungsten. The metal layer that forms the barrier layer may preferably have a film thickness of about 50–200 nm in consideration of the film thickness of a metal nitride layer and a metal oxide layer that are formed in later steps.

In a preferred embodiment, the heat treatment in step (b) may preferably be conducted at temperatures of about 600–900° C. When the heat treatment is conducted in this temperature range, a metal nitride layer is formed with a sufficient film thickness to maintain a higher barrier capability.

In a preferred embodiment, the atmosphere including the oxygen in step (c) may preferably include at least about 10–30% oxygen. This step is employed to bring oxygen in contact with the surfaces of the metal nitride layer.

In a preferred embodiment, the heat treatment in step (d) may preferably be conducted at temperatures of about 600° C. or higher. When the heat treatment is conducted in this temperature range, the metal nitride layer is densified better. The nitrogen atmosphere in step (d) may preferably be under normal pressure.

Other features and advantages of the invention will be apparent from the following detailed description, taken in conjunction with the accompanying drawings which illustrate, by way of example, various features of embodiments of the invention.

PREFERRED EMBODIMENTS

Referring to FIGS. 1–6, a method of manufacturing a semiconductor device will be described. FIG. 7 schematically shows a cross-sectional view of a semiconductor device manufactured by a method in accordance with one embodiment of the present invention.

Figure 1:
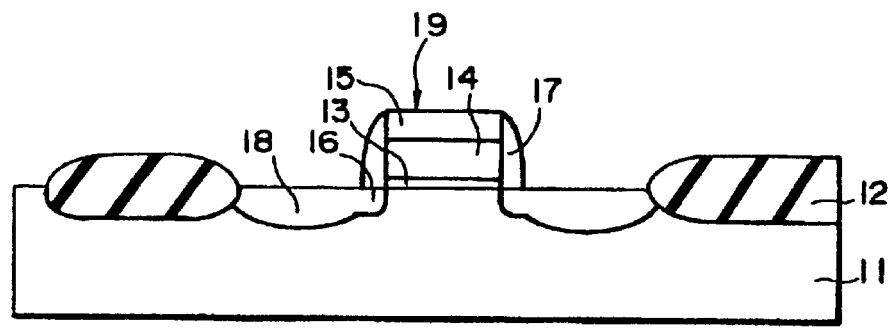
FIG. 1 schematically shows a step in a process of making a semiconductor device in cross-section in accordance with the present invention.

A MOS device is formed in a silicon substrate 11 by a commonly practiced method, as shown in FIG. 1. More specifically, for example, a field insulation layer 12 is formed on the silicon substrate 11 by selective oxidation, and a gate oxide layer 13 is formed in an active region. A threshold voltage level is adjusted by channel injection. Then a polysilicon layer 14 is grown on the gate oxide layer 13 by thermally decomposing monosilane ($SiH_4$), and a tungsten silicide layer 15 is sputter-deposited on the polysilicon layer 14. Further, the layers are etched to a specified pattern to form a gate electrode 19.

Then, phosphorous is ion-implanted to form a low concentration impurity layer 16 for a source region or a drain region. Side-wall spacers 17 of silicon oxide films are formed on sides of the gate electrode 19. Then arsenic is ion-implanted, and the impurity is activated by an anneal treatment using a halogen lamp to thereby form a high impurity concentration layer 18 for the source region or the drain region.

Figure 2:
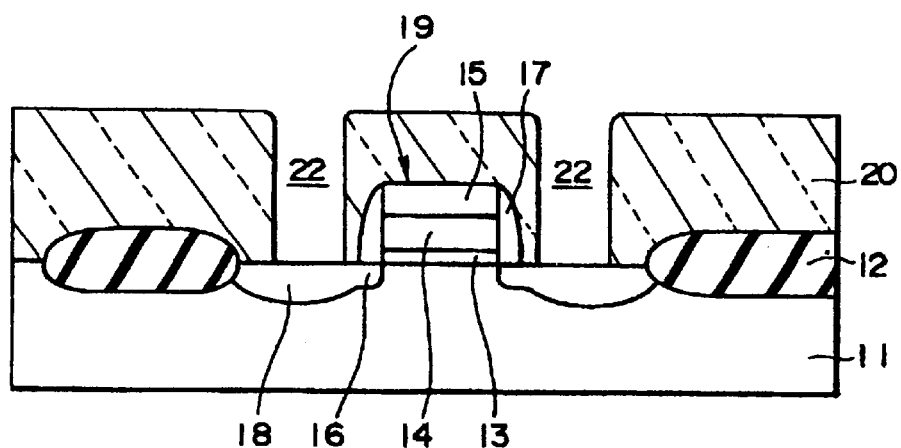
FIG. 2 schematically shows a step in the process of making a semiconductor device in cross-section that is successively performed after the step shown in FIG. 1.

Next, a silicon oxide layer (not shown) having a film thickness of about 100–200 nm, that serves as a base layer of an interlayer dielectric layer 20 shown in FIG. 2, is formed by a plasma reaction between tetraethylorthosilicate (TEOS) and oxygen. The silicon oxide layer formed by the plasma reaction does not have cuspings, and has a greater insulation, a slower etching speed against a hydrogen fluoride solution, and a higher density than a layer that is grown with $SiH_4$.

Then, a boron-doped phosphosilicate glass (BPSG) layer, having a film thickness of several hundred nm—about 1 $\mu$m, is formed on the silicon oxide layer as a planarization layer of the interlayer dielectric layer through vapor phase reaction of a silane compound, such as $SiH_4$ or TEOS with oxygen or ozone, and gases including phosphorous and boron. An anneal treatment is then performed in a nitrogen atmosphere at temperatures of about 800–900° C. to conduct a high temperature flow planarization. Instead of the high temperature flow of the BPSG layer, a commonly used SOG film can be used to conduct planarization.

Instead of the BPSG layer, a silicon oxide layer may be used that is formed by a method described in a patent application filed by the present applicant (for example, Laid-open Japanese patent application HEI 9-314518), in which a silicon compound and hydrogen peroxide are reacted by a chemical vapor deposition. The resultant silicon oxide layer has a high flowability and excellent self-planarization characteristics. This phenomenon is believed to take place due to the following mechanism. When a silicon compound and hydrogen peroxide are reacted by the chemical vapor deposition, silanol is formed in the vapor phase; and the silanol deposits on the surface of the wafer to provide a layer having a high flowability.

The silicon compounds include, for example, inorganic silane compounds, such as monosilane, disilane, $SiH_2Cl_2$, $SiF_4$, and organo silane compounds, such as $CH_3SiH_3$, tripropyle-silane, tetraethylorthosilicate and the like.

The film growth process for growing the silicon oxide layer may be preferably conducted by a reduced pressure chemical vapor deposition at temperatures of about 0–20° C., when the silicon compound is an inorganic silicon compound, and at temperatures of about 100–150° C., when the silicon compound is an organic silicon compound.

Next, the BPSG layer (planarization layer) that forms the interlayer dielectric layer 20 and the silicon oxide layer (base layer) are selectively, anisotropically etched by a reactive ion etcher containing $CHF_3$ and $CF_4$ as main gases to form through holes 22, as shown in FIG. 2. For example, in a preferred embodiment, the through hole 22 has a diameter of about 0.2–0.5 $\mu$m and an aspect ratio of about 2–5.

Figure 3:
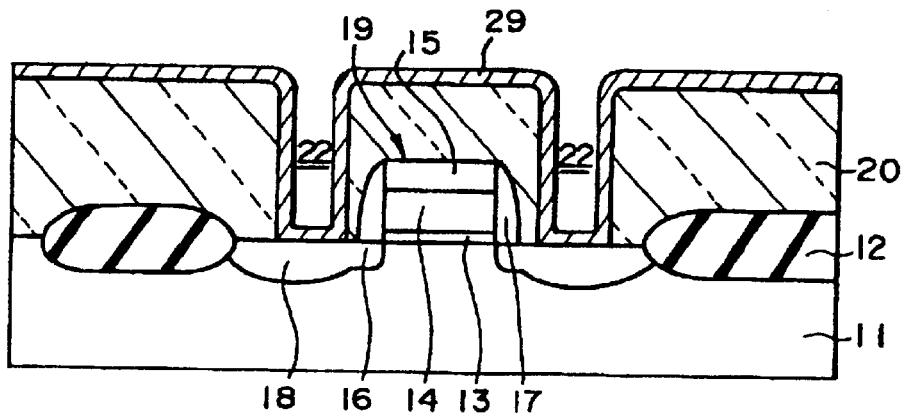
FIG. 3 schematically shows a step in the process of making a semiconductor device in cross-section that is successively performed after the step shown in FIG. 2.

As shown in FIG. 3, a titanium layer 29 is formed to a film thickness of about 50–200 nm on surfaces of the interlayer dielectric layer 20 and the through holes 22 by a super-long throw sputter apparatus in which a target and the wafer are separated from each other at a distance of about 150–320 mm. The film thickness of the titanium layer 29 at bottom sections of the through holes 22 is about 15–100 nm. Also, the titanium layer 29 provides a good coverage over the through holes 22 and has almost no overhang at upper sections of the through holes 22. The super-long throw sputtering employed to form the titanium layer 29 makes the pinch-off phenomenon difficult to occur. In the pinch-off phenomenon, a through hole may be closed by reaction between a metal that forms a wetting layer and aluminum that forms an embedded layer over the through hole.

Figure 4:
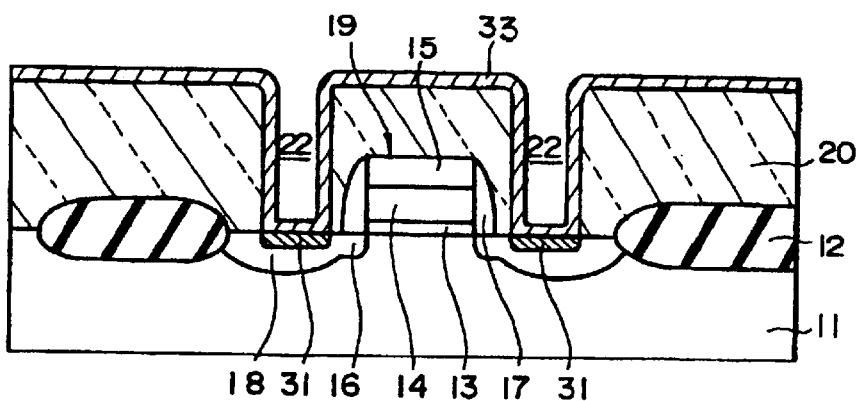
FIG. 4 schematically shows a step in the process of making a semiconductor device in cross-section that is successively performed after the step shown in FIG. 3.
Figure 5:
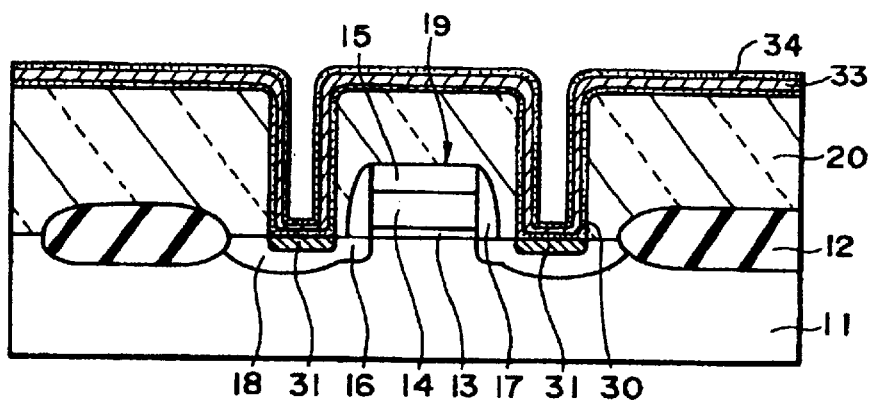
FIG. 5 schematically shows a step in the process of making a semiconductor device in cross-section that is successively performed after the step shown in FIG. 4.

Metals other than titanium, such as cobalt, ruthenium, molybdenum, hafnium, niobium, tantalum, vanadium and tungsten, may be used as a metal that forms the barrier layer Then, a lamp anneal heat treatment (first heat treatment) is conducted in a nitrogen atmosphere under normal pressure at temperatures of about 600–900° C. and, more preferably, at temperatures of about 700–850° C. for 20–60 seconds. By this heat treatment, the titanium layer 29 changes to a titanium nitride layer 33, as shown in FIG. 4. Also, a titanium silicide layer 31 is formed by reaction between titanium and silicon that occurs in a boundary region between the titanium layer 29 and the silicon substrate 11. When the heat treatment is conducted at temperatures of about 600–900° C., a metal nitride layer is formed with a sufficient film thickness that provides a better barrier capability. If the heat treatment is conducted at temperatures below about 600° C., titanium and silicon do not sufficiently react with each other, and the resultant titanium silicide layer 31 having a low resistance cannot be obtained. If the heat treatment is conducted at temperatures over about 900° C., titanium and silicon excessively react with each other. As a result, leaks at junctions and short circuits between adjacent transistors occur. The first heat treatment may preferably be conducted in a nitrogen atmosphere with an oxygen concentration of about 0.1 ppm or lower.

Then, the wafer is placed in an atmosphere containing oxygen, such as, for example, in the air, so that the titanium nitride layer 33 is brought in contact with oxygen. By this step, oxygen is adsorbed on the surface of the titanium nitride layer 33. Alternatively, in this step, the wafer may be placed in an atmosphere containing oxygen of about 10–30% in concentration, instead of the air.

Then, a heat treatment for annealing (second heat treatment) is conducted in a furnace in a nitrogen atmosphere at temperatures of 600° C. or higher and, more preferably at temperatures of about 600–900° C. for about 20–60 minutes. By this treatment, the titanium nitride layer 33 is densified and the resistance of the titanium silicide layer 31 is lowered. At the same time, a plurality of titanium oxide layers are formed. As shown in FIG. 7, for example, a first titanium oxide layer (a first metal oxide layer) 30 is formed under the titanium nitride layer 33 and in a boundary region between the titanium silicide layer 31 and the titanium nitride layer 33, and a second titanium oxide layer (a second metal oxide layer) 34 is formed on surfaces of the titanium nitride layer 33. In a preferred embodiment, the first titanium oxide layer 30 is in an amorphous form. In a preferred embodiment, the second titanium oxide layer 34 is randomly formed on the surface of the titanium nitride layer 33 and is in the amorphous state.

As described above, the barrier layer has an excellent barrier capability, due to the densified titanium nitride layer 33 and the presence of the first and second titanium oxide layers 30 and 34. Since the first and second titanium oxide layers 30 and 34 have controlled film thickness, the barrier layer is provided with a sufficient conductivity.

By the steps described above, the barrier layer has at least the first titanium oxide layer 30, the titanium nitride layer 33 and the second titanium oxide layer 34.

After the second heat treatment is performed, an oxygen plasma treatment may be conducted if required. In the oxygen plasma treatment, the layers are exposed to oxygen plasma at pressures of about $0.1 \times 10^2$–$1.5 \times 10^2$ Pa for about 10–100 seconds and annealed in a nitride or hydrogen atmosphere at temperatures of about 450–700° C. for about 10–60 minutes. As a result of the oxygen plasma treatment, titanium oxides in the form of islands are formed in the titanium nitride layer of the barrier layer. It has been confirmed that this treatment increases the barrier capability of the barrier layer. Also, by this treatment, when a metal that forms a wiring layer, for example aluminum, is filled in a through hole, the filling is promoted by boundary diffusion and the metal is filled very well in the through hole.

As an alternative method for forming titanium oxides in the form of islands in the barrier layer, a heat treatment may be conducted at temperatures of about 400–800° C. in a lamp anneal furnace containing at least several hundreds ppm—several % of oxygen therein. The barrier capability of the barrier layer can also be further improved.

The barrier layer obtained by the process described above has a greatly improved barrier capability because: first, a metal nitride layer of the barrier layer is densified, and, second, at least one metal oxide layer is formed in the barrier layer.

Next, a heat treatment, including a degasification process, is described below.

Lamp heating (heat treatment A) is conducted in a lamp chamber under base pressures of about $1.5 \times 10^{-4}$ Pa or lower, at temperatures of about 150–250° C. for about 30–60 seconds. Then, in another chamber where argon gas is introduced at pressures of about $1 \times 10^{-1}$–$15 \times 10^{-1}$ Pa, a heat treatment (degasification step: heat treatment B) is conducted at temperatures of about 300–550° C. for about 30–120 seconds to perform a degasification process.

In this step, first, as a main object, the entire wafer, including its rear surface and side surface, is heated in the heat treatment A to remove water content that adheres on the wafer.

Then, in the heat treatment B, gasification components (oxygen, hydrogen, water and nitrogen) in a planarization layer (such as the BPSG layer that forms the interlayer dielectric layer 20) are removed, as a main object. As a result, generation of gasification components from the BPSG layer can be prevented during film formation of an aluminum film performed in the next step.

The barrier layer contains gasification components (oxygen, hydrogen, water, nitrogen) of several ten atom % in solid solution. Accordingly, it is important to remove the gasification components in the interlayer dielectric layer 20 after forming the barrier layer in order to successfully form an aluminum film in the through holes. Unless the gasification components are sufficiently removed from the planarization layer below the barrier layer, there are instances where the gasification components in the planarization layer may be discharged and enter the barrier layer at a barrier layer formation temperature (normally 300° C. or higher). Further, the gases are discharged from the barrier layer when an aluminum film is formed and come out into a boundary between the barrier layer and the aluminum film, causing deteriorating effects on cohesiveness and fluidity of the aluminum layer.

Depending on the requirements, a film of a metal such as titanium, niobium and tungsten is formed to a film thickness of about 20–50 nm at normal temperature to thereby form a wetting layer 35.

A heat treatment (heat treatment C) is then conducted in a lamp chamber at temperatures of about 150–250° C. for about 30–60 seconds under base pressures of about $1.5 \times 10^{-4}$ Pa or lower to remove substances such as water adhered to the substrate. Then, before an aluminum layer is formed, the substrate temperature is lowered to about 100° C. or lower and, more preferably to the normal temperature −50° C. This cooling process lowers the temperature of the substrate which has been heated up through the heat treatment C. For example, the wafer is placed on a stage equipped with a water cooling function to cool the wafer to a predetermined temperature.

By cooling the wafer in the manner described above, the amount of gases which may be discharged from the interlayer dielectric layer 20, the barrier layer and the entire surface of the wafer at the time of film formation of a first aluminum layer are reduced to a minimum amount. As a result, the cooling process prevents the deteriorating effects of the gases which may be adsorbed on the boundary between the barrier layer and the aluminum layer and thus damage their coverage and cohesiveness.

The above-described cooling process may preferably be performed using a sputter apparatus for forming aluminum films that has a plurality of chambers, each having a structure substantially the same or similar to one another. For example, the sputter apparatus may have a stage equipped with a cooling capability, and a substrate may be placed on the stage to reduce the substrate temperature to a predetermined temperature.

FIG. 8(a) schematically shows an example of a sputter apparatus, including a stage that is equipped with a cooling function. FIG. 8(b) is a plan view of an example of a stage.

The sputter apparatus has a plurality of chambers 50. Each of the chambers 50 has a structure similar to each other. In a preferred embodiment, each of the chambers 50 has substantially the same structure. The chamber 50 contains a target 51, functioning also as an electrode, and an electrode 52, functioning also as a stage. The electrode 52 is structured to mount a substrate (wafer) W to be cooled. The chamber 50 is provided with an exhaust system 60 that maintains the interior of the chamber in a reduced pressure state, and a first gas supply channel 53 for supplying gases to the chamber when sputtering aluminum layers. The electrode 52 defines a top surface and includes a protruded support section 52a, provided on the top surface along its outer periphery as shown in FIG. 8(b). The protruded support section 52a provides a predetermined space between the electrode 52 and the substrate W, when the substrate W is placed on the electrode 52. A second gas supply channel 54 is connected to the electrode 52. A heat conductive medium, such as, for example, argon gas, is supplied in the space between the electrode 52 and the substrate W through the second gas supply channel 54. The electrode 52 also serves as a cooling system to cool the substrate W. The electrode 52 is controlled to have a constant temperature by a coolant that is supplied through a coolant supply channel 56, for example, by a circular flow of water. The top surface of the electrode 52 has grooves 58 formed in a specified pattern to uniformly supply gases in the space. For example, as shown in FIG. 8(b), the electrode 52 has a plurality of concentric circular grooves and a plurality of generally straight grooves diagonally crossing across the circular groove to uniformly supply gases in the space. A gas discharge port 54a, communicating with the second gas supply channel 54, is provided generally at an intersection of the straight grooves.

The above-described sputter apparatus is used to cool the substrate (wafer) in the following manner.

The interior of the chamber 50 is maintained in a reduced pressure state of about $6 \times 10^{-6}$ Pa or lower by the exhaust system 60. The substrate W is mounted on the support section 52a of the electrode 52. The substrate W is cooled while a gas that serves as a heat conductive medium between the electrode 52 and the substrate W is supplied in the space between the electrode 52 and the substrate W through the second gas supply channel 54. The pressure of the space is maintained at about 600–1000 Pa, and gases that leak from the space into the chamber are exhausted by the exhaust device 60.

Figure 6:
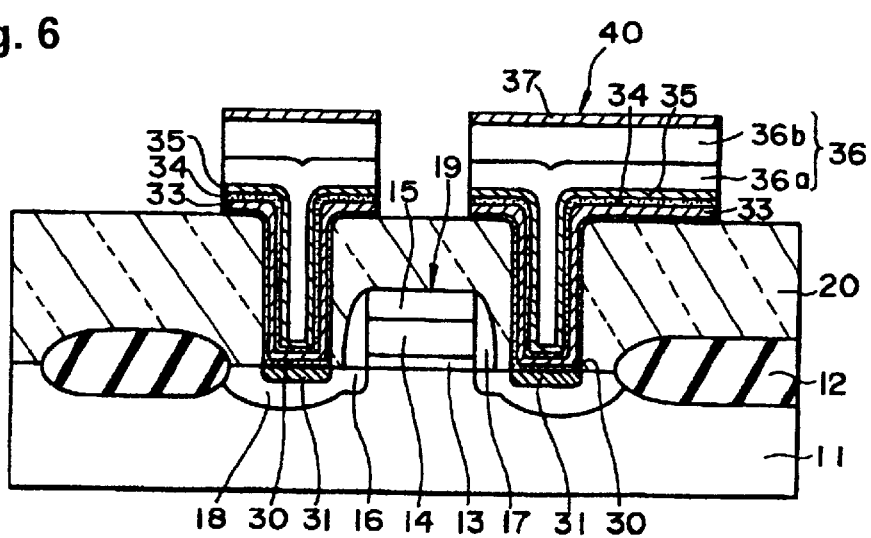
FIG. 6 schematically shows a step in the process of making a semiconductor device in cross-section that is successively performed after the step shown in FIG. 5.
Figure 7:
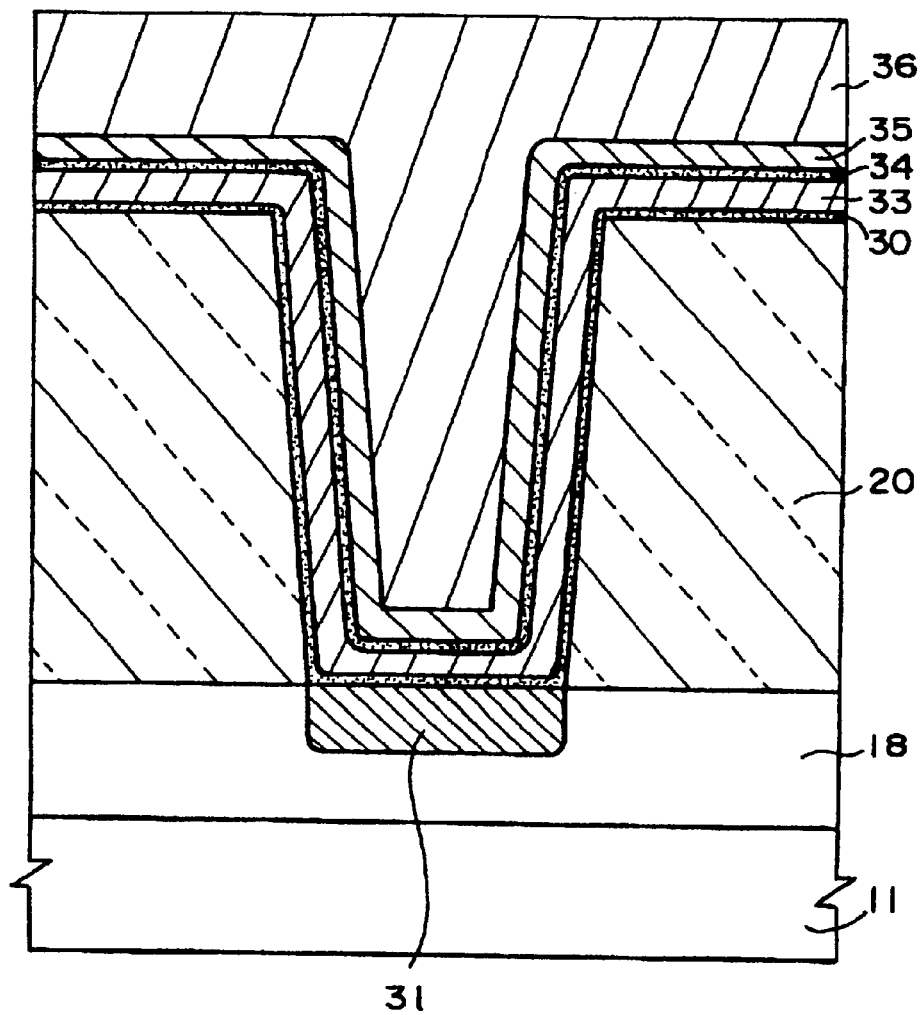
FIG. 7 shows an enlarged cross-section of a main section of the semiconductor device.

Referring to FIG. 6, film formation of aluminum films will be described below.

A first aluminum layer 36a, shown in FIG. 6, is formed by sputtering aluminum containing about 0.2–1.0 wt % of copper at a high speed at temperatures of about 200° C. or lower and, more preferably, at about 30–100° C., to a film thickness of about 150–300 nm. In this film formation step, the distance between the target and the wafer may preferably be set at 150–320 mm. Then, the substrate temperature is elevated to about 350–460° C. in the same chamber, and aluminum similarly containing copper (e.g., 0.2–1.0 wt % of copper) is sputtered at a low speed to form a second aluminum layer 36b having a thickness of about 300–600 nm. In this film formation step, the distance between the target and the wafer may preferably be set at 45–200 mm. Here, the level of "high speed" for film formation of the aluminum layers 36 may vary, depending on the film forming condition and design specifications of a device to be manufactured. However, in this embodiment, the term "high speed" refers to sputtering speeds of about 10 nm/second or faster, and the term "low speed" refers to sputtering speeds of about 3 nm/second or slower.

Figure 8:
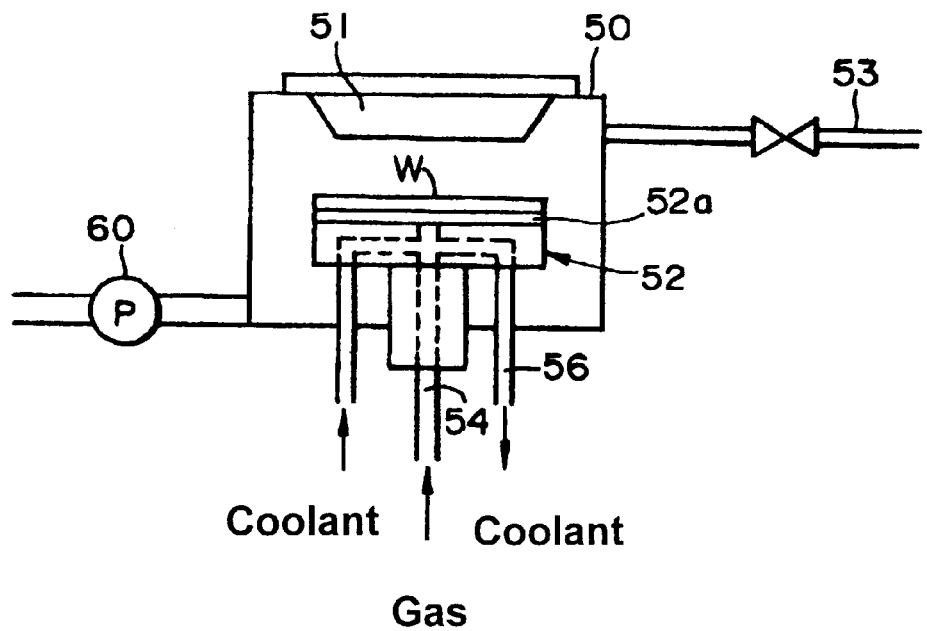
FIG. 8(*a*) schematically shows an example of a sputtering apparatus used for a process of making a semiconductor device in accordance with the present invention, and (*b*) shows an example of a stage of the sputtering apparatus.
Figure 8:
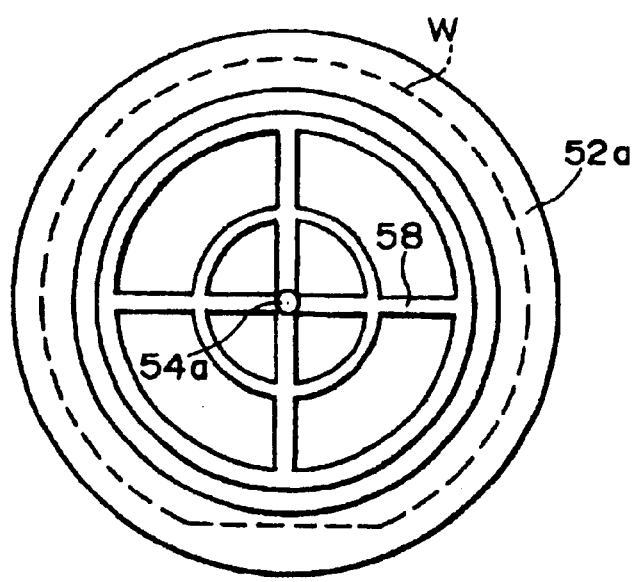

Aluminum sputtering may preferably be performed in the sputter apparatus, shown in FIG. 8, that is used when the wafer is cooled. In this manner, the cooling process and the aluminum film forming process are conducted in the same apparatus that is controlled to have a reduced pressure condition. As a result, the number of steps required for moving and mounting substrates is reduced, and therefore the process is simplified and pollution of the substrates is substantially prevented.

Both of the first gas supply channel 53 and the second gas supply channel 54, in the sputter apparatus shown in FIG. 8, supply argon gas. The temperature of the aluminum layer during the film formation process is the temperature (substrate temperature) of the substrate (wafer) W that is controlled by the gas supplied through the second gas supply channel 54.

For example, the substrate temperature is controlled as follows. The stage 52 is pre-heated to a temperature for forming the second aluminum layer 36b (at about 350–500° C.), for example. When the first aluminum layer 36a is formed, the substrate temperature is gradually elevated by heat of the stage 52 without gas supply from the second gas supply channel 54. When the second aluminum layer is formed, the substrate temperature is controlled to rapidly rise by supplying heated gas through the second gas supply channel 54, and to be stabilized at a predetermined temperature level.

By successively forming the first aluminum layer 36a and the second aluminum layer 36b in the same chamber, the temperature and the power for sputtering can be precisely controlled and thereby stable aluminum films are effectively formed at a lower temperature than the conventional method.

The film thickness of the first aluminum layer 36a is selected to be in an appropriate range in consideration of the capability of forming successive layers with good step coverage and the capability to control discharge of gasification components from the barrier layer and the interlayer dielectric layer 20 below the aluminum layer. For example, the film thickness of the first aluminum layer 36a may preferably be between about 200–400 nm. The film thickness of the second aluminum layer 36b is determined by the size of a through hole and its aspect ratio. For example, the film thickness of about 300–1,000 nm is necessary to cover a through hole having a diameter of about 0.5 μm or smaller and an aspect ratio of about 3.

An anti-reflection layer 37 is then formed to a film thickness of about 30–80 nm by sputter-depositing titanium nitride in another sputter chamber. Then, a metal wiring layer 40 is patterned by selectively etching a laminated layer containing the barrier layer, the aluminum layer 36 and the antireflection layer 37, using anisotropic dry etcher mainly containing $Cl_2$ and $BCl_3$ gases.

In the metal wiring layer 40 formed in this manner, a through hole with an aspect ratio of about 0.5–3 and a diameter of about 0.2–0.8 μm is filled by aluminum with good step coverage without creating voids.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A method for manufacturing a semiconductor device comprising:
    forming a through hole in an interlayer dielectric layer formed on a semiconductor substrate having a device element; and
    forming a barrier layer on surfaces of the interlayer dielectric layer and the through hole;
    wherein the step of forming the barrier layer comprises:
        forming a metal layer on surfaces of the interlayer dielectric layer and the through hole;
        conducting a first heat treatment in a nitrogen atmosphere to form a metal nitride at least on a surface of the metal layer;
        contacting the metal nitride layer with oxygen in an atmosphere including oxygen; and
        conducting a second heat treatment in a nitrogen atmosphere to form two metal oxide layers on an upper and lower surface of the metal nitride layer, respectively, and to density the metal nitride layer.

2. A method for manufacturing a semiconductor device according to claim 1, wherein the second heat treatment forms a first metal oxide layer adjacent to a top surface of the metal nitride layer and a second metal oxide layer adjacent to a boundary between the metal nitride layer and the interlayer dielectric layer.

3. A method for manufacturing a semiconductor device according to claim 1, wherein the barrier layer includes:
    a first metal oxide layer formed from an oxide of a metal that forms the barrier layer;
    a metal nitride layer formed from a nitride of the metal that forms the barrier layer; and
    a second metal oxide layer formed from an oxide of the metal that forms the barrier layer.

4. A method for manufacturing a semiconductor device according to claim 3, wherein the first metal oxide layer is formed adjacent to a top surface of the metal nitride layer and the second metal oxide layer is formed adjacent to a boundary between the metal nitride layer and the interlayer dielectric layer.

5. A method for manufacturing a semiconductor device according to claim 1, wherein the step of forming the barrier layer further includes conducting an oxygen plasma treatment after the second heat treatment to expose the metal nitride layer to oxygen plasma at pressures of about $0.1 \times 10^2$–$1.5 \times 10^2$ Pa and conducting an anneal treatment in one of a nitride atmosphere and a hydrogen atmosphere.

6. A method for manufacturing a semiconductor device according to claim 1, wherein the step of forming the barrier layer further includes conducting a heat treatment at temperatures of about 400–800° C. in an atmosphere containing at least several hundreds ppm—several % of oxygen.

7. A method for manufacturing a semiconductor device according to claim 1, wherein, the first heat treatment is conducted at temperatures of about 600–900° C.

8. A method for manufacturing a semiconductor device according to claim 1, the atmosphere including oxygen includes at least about 10–30% of oxygen.

9. A method for manufacturing a semiconductor device according to claim 1, wherein the second heat treatment is conducted at temperatures of about 600° C. or higher.

10. A method for manufacturing a semiconductor device according to claim 1, wherein the nitrogen atmosphere in the second heat treatment is under normal pressure.

11. A method for Manufacturing a semiconductor device according to claim 1, wherein the metal layer that forms the barrier layer is selected from a group consisting of titanium, cobalt, ruthenium, molybdenum, hafnium, niobium, vanadium, tantalum, and tungsten.

12. A method for manufacturing a semiconductor device according to claim 1, wherein the metal layer that forms the barrier layer is sputter-deposited to a film thickness of about 50–200 nm.

13. A method for manufacturing a semiconductor device according to claim 1, wherein a wiring layer is deposited on the barrier layer wherein the wiring layer is composed of aluminum or an alloy including aluminum as a main component.

14. A method for manufacturing a semiconductor device comprising:
    forming a though hole in an interlayer dielectric layer formed on a semiconductor substrate having a device element; and
    forming a barrier layer on surfaces of the interlayer dielectric and the through hole;
    wherein the step of forming the barrier layer comprises:
        forming a metal layer on surfaces of the of the interlayer dielectric and the through hole;
        conducting a first heat treatment in a nitrogen atmosphere to form a metal nitride at least on a surface of the metal layer;
        contacting the metal nitride layer with oxygen in an atmosphere containing oxygen;
        conducting a second heat treatment in a nitrogen atmosphere to form two metal oxide layer on an upper and lower surface of the metal nitride layer, respectively, and to density the metal nitride layer; and
        conducting an oxygen plasma treatment of the barrier layer.

* * * * *